United States Patent [19]

Kim

[11] Patent Number: 5,107,266
[45] Date of Patent: Apr. 21, 1992

[54] ALGORITHMIC ANALOG/DIGITAL CONVERTING CIRCUIT

[75] Inventor: Chung Wol Kim, Kyungki, Rep. of Korea

[73] Assignee: Goldstar Electron Co., Ltd., Choongchungbook, Rep. of Korea

[21] Appl. No.: 698,675

[22] Filed: May 10, 1991

[30] Foreign Application Priority Data

May 12, 1990 [KR] Rep. of Korea ............... 6768/1990

[51] Int. Cl.$^5$ ............................................ H03M 1/40
[52] U.S. Cl. ................................. 341/163; 341/162; 341/172
[58] Field of Search ............... 341/118, 122, 155, 158, 341/162, 163164, 165, 172

[56] References Cited

U.S. PATENT DOCUMENTS

| | | |
|---|---|---|
| 3,585,634 | 6/1971 | Sharples .......................... 341/172 |
| 4,119,960 | 10/1978 | Hill ................................... 341/163 |
| 4,143,362 | 3/1979 | Ulmer ............................... 341/155 |
| 4,325,055 | 4/1982 | Colardelle et al. ............... 341/172 |
| 4,529,965 | 7/1985 | Lee ................................... 341/172 |
| 4,691,190 | 9/1987 | Robinson ......................... 341/162 |
| 4,760,376 | 7/1988 | Kobayashi et al. .............. 341/172 |

Primary Examiner—Howard L. Williams
Attorney, Agent, or Firm—Christie, Parker & Hale

[57] ABSTRACT

An algorithmic analog/digital converting circuit in accordance with the present invention comprising a control signal generator for inputting a least significant bit signal from a shift register, a start signal and a clock signal to output a first to a tenth switching signals for controlling ON/OFFs of a first to tenth switches and a latch signal for controlling latch of said shift register, in order to perform an operation of steps of sampling an input signal and a reference voltage signal, comparing the sampled input signal with the sampled reference voltage signal, subtracting or holding in accordance with an output signal from a comparator reproducing the subtracted or held signal and amplifying the reproduced signal. Therefore, in accordance with the present invention, there can be provided the algorithmic analog/digital converting circuit which is capable of reducing the layout area on chip by reducing the number of its condensers and operational amplifiers, and requiring no further techniques for the offset voltage by ofsetting the offset voltage from the operational amplifier by the switching control without use of condenser.

6 Claims, 4 Drawing Sheets

ALGORITHMIC ANALOG/DIGITAL CONVERTING CIRCUIT

BACKGROUND OF THE INVENTION

1. Field of the Invention

The present invention relates in general to an analog/digital converter, and more particularly to an algorithmic analog/digital converting circuit which is capable of reducing a layout area on chip and being operated regardless of an offset voltage from its operational amplifier.

2. Description of the Prior Art

Generally, an analog/digital converter may be representatively classified into an algorithmic analog/digital converting circuit and a digital signal processing circuit.

FIG. 1 is a schematic circuit diagram of an embodiment of a conventional algorithmic analog/digital converting circuit. As shown in the drawing, the conventional algorithmic analog/digital converting circuit comprises a plurality of switches SW1 to SW4 adapted for determining a flow of signal, a sample and hold circuit S/H adapted for sampling and holding a signal selected by said switches SW1 to SW4, an operational amplifier OP1 adapted for amplifying an output voltage signal from said sample and hold circuit S/H by double, a comparator CP1 adapted for comparing an output voltage signal from said operational amplifier OP1 with a reference voltage VR to output a control signal to said switches SW1 to SW4, an adder 1 responsive to said control signal from said comparator CP1 for outputting either said output voltage signal from said operational amplifier OP1 naturally or a resultant signal produced by subtracting said output voltage signal from said operational amplifier OP1 from said reference voltage VR to said sample and hold circuit S/H. The switches SW1 to SW4 each is composed of a MOS transistor.

Now, the operation of the conventional algorithmic analog/digital converting circuit constructed as above-mentioned will be described.

First, if the switch SW2 turns on, an input signal Vin is transferred through the switch SW2 to the sample and hold circuit S/H, which then samples and holds the signal Vin. Then, the operational amplifier OP1 amplifies the output voltage signal from the sample and hold circuit S/H by double and outputs the amplified voltage signal to an inverting input terminal of the comparator CP1, which then compares the amplified voltage signal from the operational amplifier OP1 with the reference voltage VR. Then, if the output voltage signal from the operational amplifier OP1 is not higher than the reference voltage VR, the comparator CP1 outputs a high voltage signal enabling the switch SW1 to turn on. If the output voltage signal from the operational amplifier OP1 is higher than the reference voltage VR, the comparator CP1 outputs a low voltage signal enabling the switch SW3 to turn on.

For this reason, as the switch SW1 or the switch SW3 turns on, the adder 1 outputs either the output voltage signal from the operational amplifier OP1 naturally or a resultant signal produced by subtracting the output voltage signal from the operational amplifier OP1 from the reference voltage VR to the sample and hold circuit S/H, which inputs the output voltage signal from the adder 1 when the switch SW2 in next sequence is turned on and then samples and holds the input signal. In order to achieve the analog/digital conversion, the operation as hereinbefore described is repeatedly performed.

Referring to FIG. 2 which is a detailed circuit diagram of an alternative embodiment of the conventional algorithmic analog/digital converting circuit, first, a condenser C1 is charged with an input signal Vin while a condenser C6 is charged with the offset voltage from an operational amplifier OP1 if switches SW2, SW4, SW5 and SW6 turn on.

Thereafter, if switches SW3 and SW5 turn on, the charge on the condenser C1 moves to a condenser C2 and the voltage sampled by the condenser C1 then appears at an output terminal of the operational amplifier OP1, which then charges a condenser C3 with the voltage sampled by the condenser C1.

When switches SW1 and SW4 are turned on, the voltage on the condenser C3 is transferred to a condenser C4 by an operational amplifier OP2 and the condenser C6 is charged with the same voltage as that on the condenser C4. At this time, the charged voltage on the condenser C2 is fully discharged, wherein a capacitance relationship between the used condensers C1 to C5 can be expressed as follows:

$$C1 = C2 = C3 = C4 = \tfrac{1}{2}C5$$

Thereafter, if the switches SW3 and SW5 turn on, the charged voltage on the condenser C5 transfers to the condenser C2, and at the same time the charged reference voltage VR on the condenser C1 transfers to the condenser C2. Therefore, in accordance with the capacitance relationship between the used condensers as above-mentioned, the operational amplifier OP1 outputs a resultant signal produced by subtracting the reference voltage VR from twice the original voltage sampled by the condenser C1 to a comparator CP1, which then converts the resultant signal into a signal which can be applied to a logic circuit. Then, the operation as hereinbefore described is repeatedly performed correspondingly to a predetermined number of bits.

In the conventional algorithmic analog/digital converting circuit, however, the three condensers C3, C4 and C5 and the operational amplifier OP2 must be used to amplify the sampled signal by double and the condenser C6 must be used to offset the offset voltage from the operational amplifier OP1. As the result, the algorithmic circuit is complex, thereby causing a layout area on chip to be larger.

SUMMARY OF THE INVENTION

Therefore, it is an object of the present invention to provide an algorithmic analog/digital converting circuit which is capable of reducing a layout area on chip by amplifying a sampled signal by double without further operational amplifier and condenser, and requiring no further techniques for an offset voltage by offsetting the offset voltage from an operational amplifier by means of a switching control without use of condenser.

In accordance with the present invention, the object can be accomplished by providing an algorithmic analog/digital converting circuit comprising: a terminal for receiving an input signal; a terminal for receiving a reference voltage signal; a first to a tenth switches; a first and a second condensers; an operational amplifier including a non-inverting input terminal connected to said input signal receiving terminal, said reference voltage signal receiving terminal and ground via said first to said third switches respectively and also connected to ground via said fourth switch, said first condenser and said ninth switch, an inverting input terminal connected to both ends of said first condenser via said sixth switch and said eighth switch respectively, said both ends of said first condenser being connected to said second condenser via said sixth switch and said eighth switch respectively, and an output terminal; a comparator including a non-inverting input terminal connected directly to said output terminal of said operational amplifier, via said tenth switch to said second condenser and said inverting input terminal of said operational amplifier and via said fifth switch and said seventh switch to said both ends of said first condenser respectively, an inverting input terminal connected to ground, and an output terminal; a shift register including an input terminal connected to said output terminal of said comparator and outputting a least significant bit signal; and a control signal generator for inputting said least significant bit signal from said shift register, a start signal and a clock signal to output a first to a tenth switching signals for controlling ON/OFFs of said first to said tenth switches and a latch signal for controlling latch of said shift register, in order to perform an operation comprising steps of sampling said input signal and said reference voltage signal, comparing the sampled input signal with the sampled reference voltage signal, subtracting or holding in accordance with an output signal from said comparator, reproducing the subtracted or held signal and amplifying the reproduced signal.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF PREFERRED EMBODIMENTS

Figure 1:
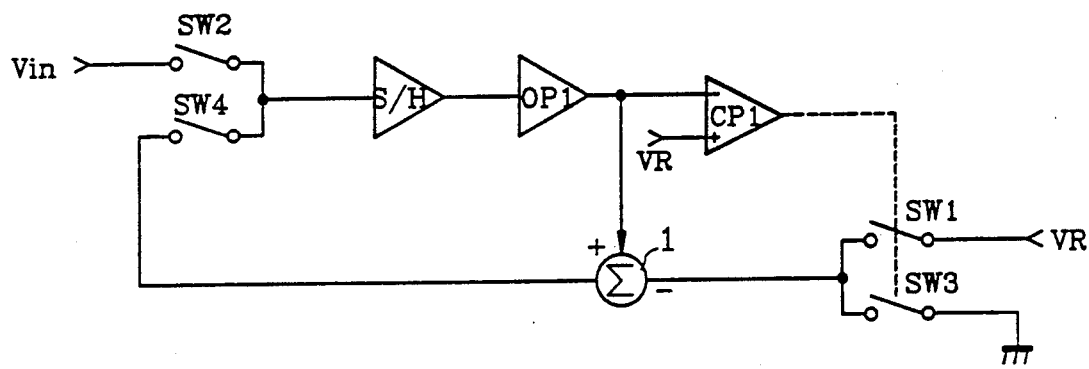
FIG. 1 is a schematic circuit diagram of an embodiment of a conventional algorithmic analog/digital converting circuit.
Figure 2:
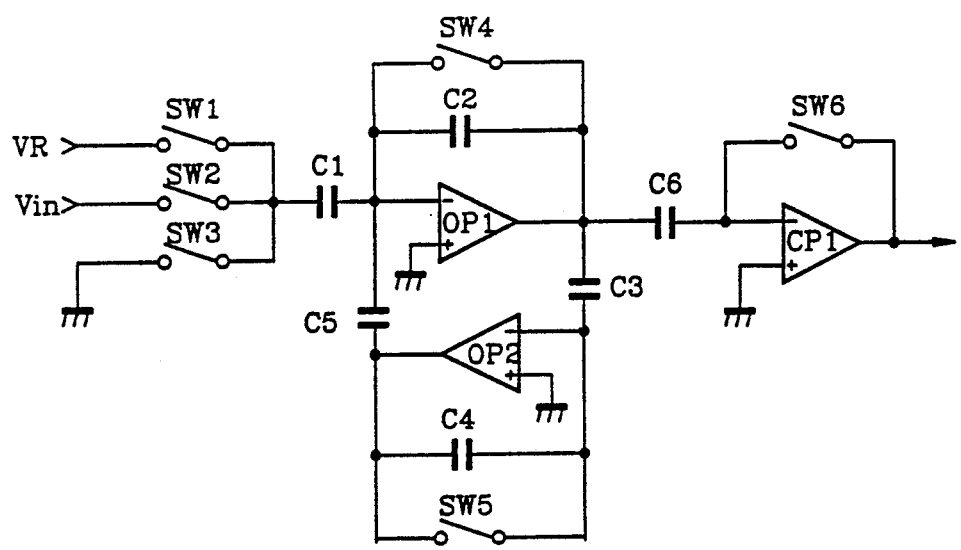
FIG. 2 is a detailed circuit diagram of an alternative embodiment of the conventional algorithmic analog/digital converting circuit.
Figure 3:
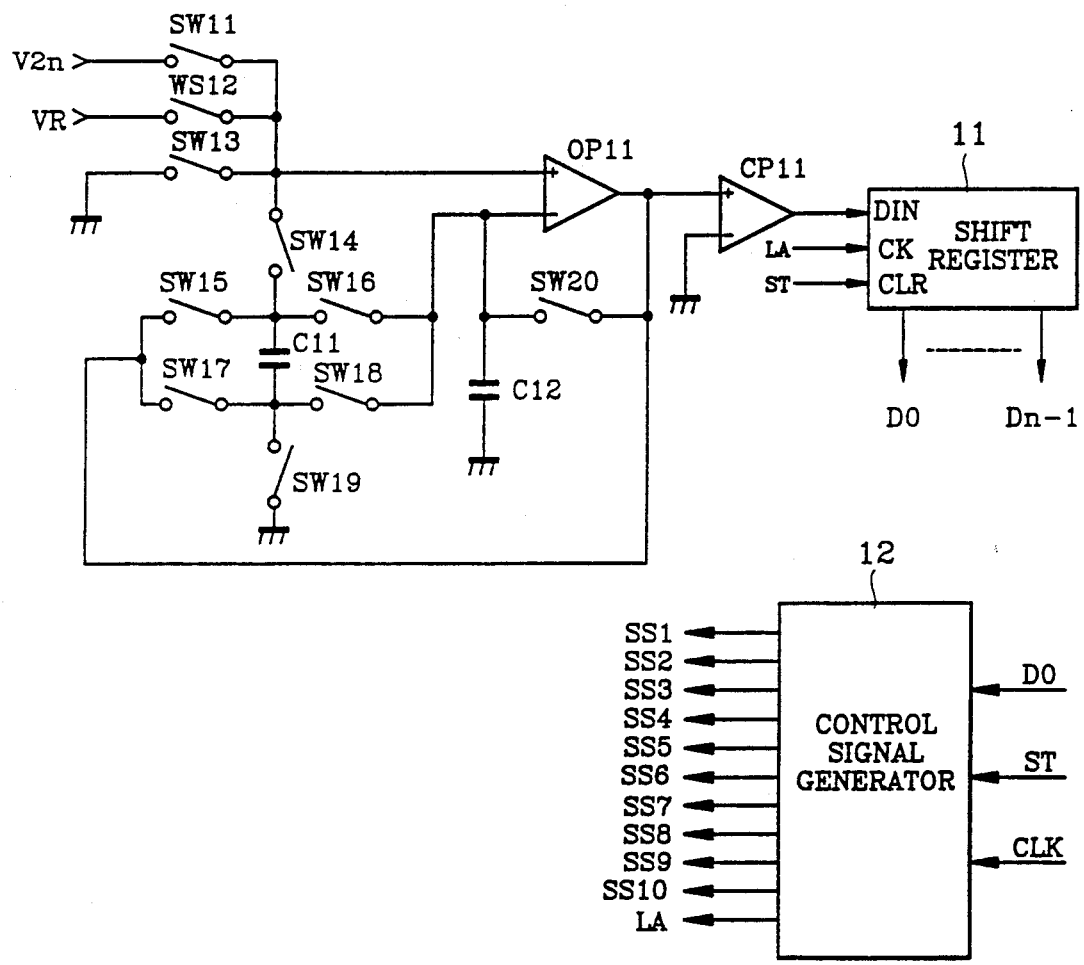

Referring now to FIG. 3, an algorithmic analog/digital converting circuit in accordance with the present invention is shown to comprise a terminal for receiving an input signal Vin, a terminal for receiving a reference voltage signal VR, a first to a tenth switches SW11 to SW20, condensers C11 and C12 and an operational amplifier OP11 including a non-inverting input terminal connected to the input signal Vin receiving terminal, the reference voltage signal VR receiving terminal and ground via the first to the third switches SW11, SW12 and SW13 respectively and also connected to ground via the fourth switch SW14, the condenser C11 and the ninth switch SW19, an inverting input terminal connected to both ends of the condenser C11 via the sixth switch SW16 and the eighth switch SW18 respectively, and an output terminal. Also, both ends of the condenser C11 are connected to the condenser C12 via the sixth switch SW16 and the eighth switch SW18 respectively.

Also, the algorithmic analog/digital converting circuit in accordance with the present invention comprises a comparator CP11 including a non-inverting input terminal connected directly to the output terminal of the operational amplifier OP11, via the tenth switch SW10 to the condenser C12 and the inverting input terminal of the operational amplifier OP11 and via the fifth switch SW15 and the seventh switch SW17 to both ends of the condenser C11 respectively, an inverting input terminal connected to ground, and an output terminal.

Also, the algorithmic analog/digital converting circuit in accordance with the present invention comprises a shift register 11 including an input terminal DIN connected to the output terminal of the comparator CP11 and outputting a least significant bit signal Do, and a control signal generator 12 for inputting the least significant bit signal Do from the shift register 11, a start signal ST and a clock signal CLK to output switching signals SS1 to SS10 for controlling ON/OFFs of the first to the tenth switches SW11 to SW20 and a latch signal LA for controlling latch of the shift register 11.

Now, the operation of the algorithmic analog/digital converting circuit constructed as above-mentioned in accordance with the present invention will be described in detail with reference to FIGS. 4A to 4M and 5.

The operation of the algorithmic analog/digital converting circuit of the present invention can be classified into five steps, that is, sampling the input signal Vin and the reference voltage signal VR, comparing the sampled input signal with the sampled reference voltage signal, subtracting or holding in accordance with the output signal from the comparator CP11, reproducing the subtracted or held signal and amplifying the reproduced signal by double.

Figure 4:
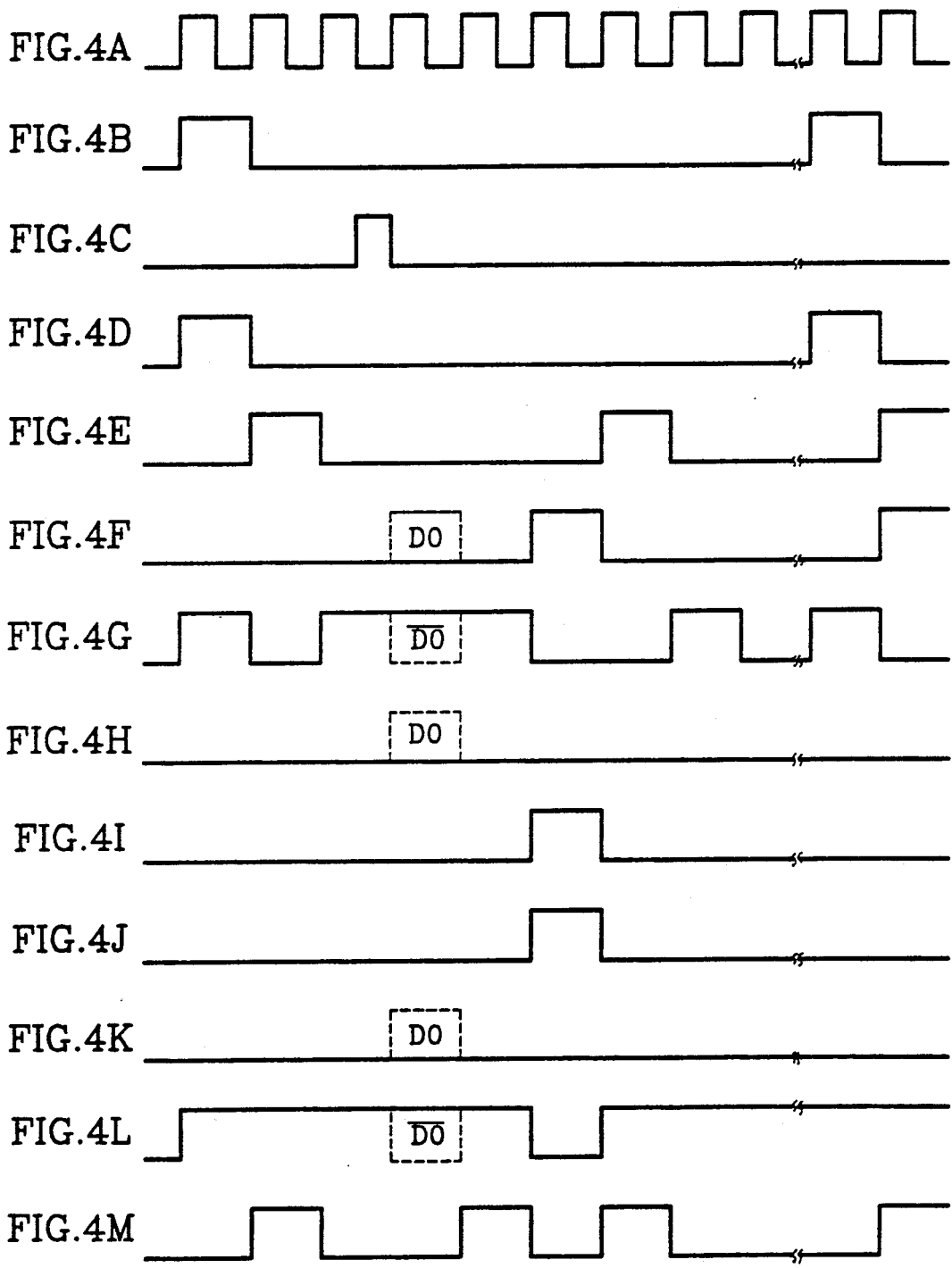
FIGS. 4A to 4M show waveform diagrams of signals from each component shown in FIG. 3.
Figure 5:
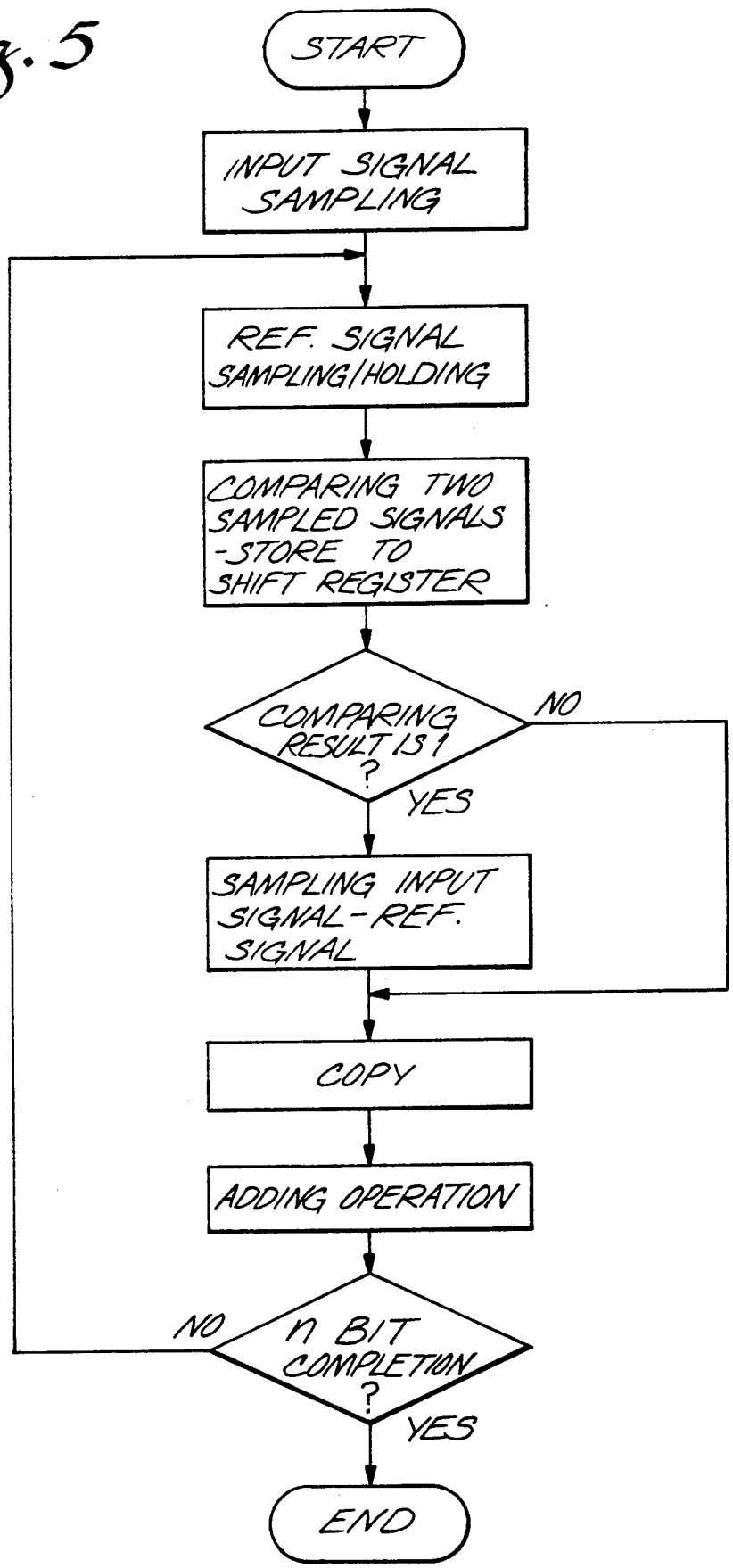
FIG. 5 is a flowchart illustrating the operation of the algorithmic analog/digital converting circuit in accordance with the present invention.

The control signal generator 12 inputs the clock signal CLK as shown in FIG. 4A, the start signal ST as shown in FIG. 4B and the least significant bit signal Do from the shift register 11 to output the latch signal LA for controlling latch of the shift register 11, as shown in FIG. 4C and the switching signals SS1 to SS10 for controlling ON/OFFs of the first to the tenth switches SW11 to SW20, as shown in FIGS. 4D to 4M.

First, upon receiving the start signal ST as shown in FIG. 4B, the control signal generator 12 outputs the switching signals SS1, SS4 and SS9 of high voltage as shown in FIGS. 4D, 4G and 4L to turn on the first, the fourth and the ninth switches SW11, SW14 and SW19 during the first cycle of the clock signal CLK. As a result, the input signal Vin is charged into the condenser C11 via the first and the fourth switches SW11 and SW14 and then sampled thereby.

Then, during the next cycle of the clock signal CLK, the control signal generator 12 outputs the switching signals SS2, SS9 and SS10 of high voltage as shown in FIGS. 4E, 4L and 4M to turn on the second, the ninth and the tenth switches SW12, SW19 and SW20. As a result, the reference voltage signal VR is charged into the condenser C12 via the second switch SW12, the operational amplifier OP11 and the tenth switch 20. At this time, if an offset voltage Vos is present at the output voltage from the operational amplifier OP11, the charged voltage VC12 on the condenser C12 can be represented as follows: $VC12 = VR - Vos$, wherein the magnitude of the reference voltage signal VR used is ½ times the maximum level of the input voltage signal for analog/digital conversion.

The comparison of the sampled input signal with the sample reference voltage signal will be thereafter performed during the subsequent cycle of the clock signal CLK. Namely, the control signal generator 12 outputs the switching signals SS4 and SS9 of high voltage as shown in FIGS. 4G and 4L to turn on the fourth and the ninth switches SW14 and SW19, thereby allowing the charged voltage on the condenser C11 to be applied to the non-inverting input terminal of the operational amplifier OP11 via the fourth switch SW14. As a result, the operational amplifier OP11 outputs a resultant signal produced by multiplying difference (VC11−VC12−Vos=VC11−VR) between the charged voltages on the condensers C11 and C12 by the gain of the operational amplifier OP11. As apparent from the above-mentioned equation, the offset voltage from the operational amplifier OP11 is offset and not present at the output voltage from the operational amplifier OP11 when the charged voltages VC11 and VC12 are compared with each other. Because the voltage applied to the non-inverting input terminal of the comparator CP11 is very high, the influence of the offset voltage from the comparator CP11 can be ignored. The comparator CP11 may not be used in accordance with the number of bits and the maximum level of the input signal for the analog/digital converter.

The signal outputted from the comparator CP11 as mentioned above is applied to the input terminal DIN of the shift register 11. The signal applied to the input terminal DIN is then latched in the least significant bith Do by the latch signal LA as shown in FIG. 4C at the trailing edge of the clock signal CLK, thereby causing data in the least significant bit to be shifted to the most significant bit.

Then, during the subsequent cycle of the clock signal CLK, the subtracting or holding operation will be performed. Namely, the subtracting operation is performed if the signal latched in the least significant bit Do of the shift register 11 is high, while the holding operation is performed if low.

In other words, if the least significant bit Do is high, the control signal generator 12 outputs the switching signals SS3, SS5 and SS8 of high voltage as shown in FIGS. 4F, 4H, and 4K to turn on the third, the fifth and the eighth switches SW13, SW15 and SW18, thereby causing the charged voltage on the condenser C12 to tranfer to the condenser C11 via the eighth switch SW18. At this time, if the capacities of the condensers C11 and C12 are adjusted to equal with each other, the charged voltage on the condenser C11 becomes VC11−VR and thus the influence of the offset voltage is not present. On the other hand,m if the least significant bit Do is low, the same operation as that of the comparison of the sampled input signal with the sampled reference voltage signal is performed as stated above.

The reproduction of the subtracted or held signal will be thereafter performed during the subsequent cycle of the clock signal CLK. Namely, the control signal generator 12 outputs the switching signals SS4, SS9 and SS10 of high voltage as shown in FIGS. 4G, 4L and 4M to turn on the fourth, the ninth and the tenth switches SW14, SW19 and SW20, thereby causing the charged voltage on the condenser C11 to transfer to the condenser C12 via the fourth switch SW14, the operational amplifier OP11 and the tenth switch 20. Therefore, the reproducing operation is complete, wherein the charged voltage on the condenser C12 becomes VC11−Vos.

Then, during the subsequent cycle of the clock signal CLK, the amplification of the reproduced signal by double will be performed. Namely, the control signal generator 12 outputs the switching signals SS3, SS6 and SS7 of high voltage as shown in FIGS. 4F, 4I and 4J to turn on the third, the sixth and the seventh switches SW13, SW16 and SW17, thereby causing the charged voltage on the condenser C12 to transfer to the condenser C11 via the sixth switch SW16. Therefore, the magnitude of the charged voltage on the condenser C12 becomes twice that of the previous voltage, namely, as follows:

$$VC11 + (VC12 + Vos) = VC11 + (VC11 - Vos + Vos) = 2VC11$$

A apparent from the above-mentioned equation, the offset voltage from the operational amplifier OP11 is offset abnd does not appear at the output terminal of the operational amplifier OP11.

Thereafter, in order to obtain the value of the subsequent digital bit data, the operation comprised of five steps as hereinbefore described is repeatedly performed until a desired analog/digital conversion is complete.

On the other hand, the first to the tenth switches SW11 to SW20 each is composed of a MOS transistor.

As hereinbefore described, in accordance with the present invention, there can be provided the algorithmic analog/digital converting circuit which is capable of reducing the layout area on chip by reducing the number of its condensers and operational amplifiers, and requiring no further techniques for the offset voltage by offsetting the offset voltage from the operational amplifier by means of the switching control without use of condenser.

Although the preferred embodiments of the invention have been disclosed for illustrative purpose, those skilled in the art will appreciate that various modifications, additions and substitutions are possible, without departing from the scope and spirit of the invention as disclosed in the accompanying claims.

What is claimed is:

1. An algorithmic analog/digital converting circuit comprising:
   a terminal for receiving a input signal;
   a terminal for receiving a reference voltage signal;
   a first to a tenth switches;
   a first and a second condensers;
   an operational amplifier including a non-inverting input terminal connected to said input signal receiving terminal, said reference voltage signal receiving terminal and ground via said first to said third switches respectively and also connected to ground via said fourth switch, said first condenser and said ninth switch, an inverting input terminal connected to both ends of said first condenser via said sixth switch and said eighth switch respectively, said both ends of said first condenser being connected to said second condenser via said sixth switch and said eighth switch respectively, and an output terminal;
   a comparator including a non-inverting input terminal connected directly to said input terminal of said operational amplifier, via said tenth switch to said second condenser and said inverting input terminal of said operational amplifier and via said fifth switch and said seventh switch to said both ends of said first condenser respectively, an inverting input terminal connected to ground, and an output terminal;

a shift register including an input terminal connected to said output terminal of said comparator and outputting a least significant bit signal; and a control signal generator for inputting said least significant bit signal from said shift register, a start signal and a clock signal to output a first to a tenth switching signals for controlling ON/OFFs of said first to said tenth switches and a latch signal for controlling latch of said shift register, in order to perform an operation comprising steps of sampling said input signal and said reference voltage signal, comparing the sampled input signal with the sampled reference voltage signal, subtracting or holding in accordance with an output signal from said comparator, reproducing the subtracted or held signal and amplifying the reproduced signal.

2. An algorithmic analog/digital converting circuit as set forth in claim 1, wherein said control signal generator outputs said first, said fourth and said ninth switching signals to turn on said first, said fourth and said ninth switches for sampling of said input signal and then outputs said second, said ninth and said tenth switching signals to turn on said second, said ninth and said tenth switches for sampling of said reference voltage signal.

3. An algorithmic analog/digital converting circuit as set forth in claim 1, wherein said control signal generator outputs said fourth and said ninth switching signals to turn on said fourth and said ninth switching signals for comparison of said sampled input signal with said sampled reference voltage signal.

4. An algorithmic analog/digital converting circuit as set forth in claim 1, wherein said control signal generator outputs said third, said fifth and said eighth switching signals to turn on said third, said fifth and said eighth switches for substraction if said sampled input signal is higher than said sampled reference voltage signal upon comparison of said sampled input signal with said sampled reference voltage signal and operates to hold an original state if said sampled input signal is lower than said sample reference voltage signal upon comparison of said sampled input signal with said sampled reference voltage signal.

5. An algorithmic analog/digital converting circuit as set forth in claim 1, wherein said control signal generator outputs said fourth, said ninth and said tenth switching signals to turn on said fourth, said ninth and said tenth switches for reproduction of said subtracted or held signal.

6. An algorithmic analog/digital converting circuit as set forth in claim 1, wherein said control signal generator outputs said third, said sixth and said seventh switching signals to turn on said third, said sixth and said seventh switches for amplification of said reproduced signal by integer times.

* * * * *

UNITED STATES PATENT AND TRADEMARK OFFICE
CERTIFICATE OF CORRECTION

PATENT NO. : 5,107,266

DATED : April 21, 1992

INVENTOR(S) : Chung Wol Kim

It is certified that error appears in the above-identified patent and that said Letters Patent is hereby corrected as shown below:

On the Title page, item [57]

In the Abstract:

Abstract, line 5, change "a first to a tenth" to
-- first to tenth --.
Abstract, line 6, change "a first to tenth" to
-- first to tenth --.
Abstract, line 8, after "operation" insert -- comprising --.
Abstract, line 19, change "ofsetting" to -- offsetting --.
Abstract, line 21, before "condenser" insert -- the --.

Column 2, line 58, before "condenser" insert -- the --.
Column 2, line 63, change "a first to a tenth" to
-- first to tenth --.
Column 2, lines 63 and 64, delete "a" before "first" and
"second" (both occurrences).
Column 2, line 68, insert commas around "respectively".

Column 3, line 54, change "a first to a tenth" to
-- first to tenth --.

Column 5, line 31, change "bith" to -- bit --.
Column 5, line 53, change "hand,m" to -- hand, --.

Column 6, line 21, change "abnd" to -- and --.
Column 6, line 37, before "condenser" insert -- the --.

UNITED STATES PATENT AND TRADEMARK OFFICE
CERTIFICATE OF CORRECTION

PATENT NO. : 5,107,266
DATED : April 21, 1992
INVENTOR(S) : Chung Wol Kim

It is certified that error appears in the above-identified patent and that said Letters Patent is hereby corrected as shown below:

Column 6, line 47, before "input" change "a" to -- an --.
Column 6, line 49, change "a first to a tenth" to -- first to tenth --.
Column 6, line 50, change "a first and a second" to -- first and second --.

Signed and Sealed this

Twenty-eighth Day of September, 1993

Attest:

BRUCE LEHMAN

*Attesting Officer*  *Commissioner of Patents and Trademarks*